(12) United States Patent
Nakayama et al.

(10) Patent No.: US 7,983,319 B2
(45) Date of Patent: Jul. 19, 2011

(54) SURFACE-EMITTING TYPE SEMICONDUCTOR LASER THAT CONTROLS POLARIZATION DIRECTIONS OF LASER LIGHT AND METHOD FOR MANUFACTURING THE SAME

(75) Inventors: Hitoshi Nakayama, Hokuto (JP); Tsugio Ide, Nagato-machi (JP); Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 45 days.

(21) Appl. No.: 12/502,748

(22) Filed: Jul. 14, 2009

(65) Prior Publication Data

US 2009/0279580 A1    Nov. 12, 2009

Related U.S. Application Data

(62) Division of application No. 10/940,984, filed on Sep. 15, 2004, now Pat. No. 7,580,436.

(30) Foreign Application Priority Data

Sep. 18, 2003    (JP) ................... 2003-326296

(51) Int. Cl.
  *H01S 5/42* (2006.01)
  *H01S 5/16* (2006.01)
(52) U.S. Cl. ............... 372/50.124; 372/46.01; 372/103
(58) Field of Classification Search ............ 372/50.124, 372/46.01, 103
See application file for complete search history.

(56) References Cited

U.S. PATENT DOCUMENTS

| | | | |
|---|---|---|---|
| 5,086,430 A | 2/1992 | Kapon et al. | |
| 5,317,584 A | 5/1994 | Mori et al. | |
| 5,727,014 A | 3/1998 | Wang et al. | |
| 5,896,408 A | 4/1999 | Corzine et al. | |
| 6,084,900 A * | 7/2000 | Claisse et al. | 372/50.124 |
| 6,154,480 A * | 11/2000 | Magnusson et al. | 372/96 |
| 6,169,756 B1 | 1/2001 | Chirovsky et al. | |
| 6,208,681 B1 | 3/2001 | Thornton | |
| 6,297,068 B1 | 10/2001 | Thornton | |
| 6,680,964 B2 | 1/2004 | Kim et al. | |
| 6,771,680 B2 | 8/2004 | Bour et al. | |
| 6,982,182 B2 | 1/2006 | Kim et al. | |
| 7,596,165 B2 * | 9/2009 | Johnson | 372/99 |

FOREIGN PATENT DOCUMENTS

| | | |
|---|---|---|
| JP | A-5-67838 | 3/1993 |
| JP | A-6-53599 | 2/1994 |
| JP | A-8-116130 | 5/1996 |
| JP | A-9-172218 | 6/1997 |
| JP | A-10-209566 | 8/1998 |
| JP | A-10-229248 | 8/1998 |
| JP | A-11-103129 | 4/1999 |
| JP | A-2003-204117 | 7/2003 |

* cited by examiner

*Primary Examiner* — Minsun Harvey
*Assistant Examiner* — Marcia A. Golub-Miller
(74) *Attorney, Agent, or Firm* — Oliff & Berridge PLC

(57) ABSTRACT

To provide surface-emitting type semiconductor lasers and methods of manufacturing the same in which the polarization direction of laser light can be readily controlled, a surface-emitting type semiconductor laser includes a vertical resonator above a substrate. The vertical resonator includes a first mirror, an active layer and a second mirror disposed in this order from the substrate. The vertical resonator has a plurality of unit resonators. An emission region of each of the unit resonators has a diameter that oscillates in a single-mode.

2 Claims, 12 Drawing Sheets

SURFACE-EMITTING TYPE SEMICONDUCTOR LASER THAT CONTROLS POLARIZATION DIRECTIONS OF LASER LIGHT AND METHOD FOR MANUFACTURING THE SAME

CROSS-REFERENCE TO RELATED APPLICATION

This is a Division of application Ser. No. 10/940,984 filed Sep. 15, 2004, which claims the benefit of Japanese Patent Publication No. 2003-326296 filed Sep. 18, 2003, the disclosures of which are hereby incorporated by reference herein in their entirety.

BACKGROUND OF THE INVENTION

1. Field of Invention

Exemplary aspects of present invention relate to surface-emitting type semiconductor lasers and methods for manufacturing the same.

2. Description of Related Art

A surface emitting semiconductor laser is a semiconductor laser which emits laser light in a direction perpendicular to a semiconductor substrate. Since surface emitting type semiconductor lasers have excellent characteristics including, for example, easy handling, low threshold currents, etc., compared to related art edge emitting semiconductor lasers, application of surface emitting type semiconductor lasers to a variety of sensors and light sources for optical communications are expected. However, the control of polarization planes of a surface-emitting type semiconductor laser is difficult because of the symmetry of its planar structure. Therefore, when a surface-emitting type semiconductor laser is used for an optical system with a polarization dependence, instability of polarization planes causes noise. In this respect, a variety of related art methods to control polarization planes are discussed below.

Japanese laid-open patent application HEI 5-67838 discloses a method to control polarization planes by providing a diffraction grating within a resonator. In this case, only specific polarization remains within the resonator, and only a mode having the polarization oscillates. However, its manufacturing method is complex and therefore stable manufacture may be difficult.

Japanese laid-open patent application HEI 6-53599 discloses a method to control polarization planes by forming quantum fine wires in an active layer. In this case, the quantum fine wire structure exhibits strong polarization characteristic because quantum confinement exists in its in-plane direction. However, its manufacturing method is complex, and therefore stable manufacture may be difficult.

Japanese laid-open patent application HEI 10-209566 discloses a method to control polarization planes by providing a control electrode. In this case, by injecting an electrical current into the control electrode, the oscillation mode and polarization of laser light can be controlled, and the beam profile can also be adjusted. However, according to this method, a power supply source for control is required, and the power consumption may increase.

SUMMARY OF THE INVENTION

Exemplary aspects of the present invention provide surface-emitting type semiconductor lasers and methods for manufacturing the same, which can readily control polarization directions of laser light.

A surface-emitting type semiconductor laser in accordance with an exemplary aspect of the present invention pertains to a surface-emitting type semiconductor laser having a vertical resonator above a substrate. The vertical resonator includes a first mirror, an active layer and a second mirror disposed in this order from the side of the substrate, and the vertical resonator has a plurality of unit resonators. An emission region of each of the unit resonators has a diameter that oscillates in a single-mode.

According to the surface-emitting type semiconductor laser, either in single-mode oscillation or multimode oscillation of laser light, the emission pattern can be formed into an optional shape by controlling the planar configuration, number and arrangement of emission regions of the unit resonators. For this reason, exemplary aspects of the present invention can be employed in light sources of laser printers, sensors and the like.

In a surface-emitting type semiconductor laser in accordance with an exemplary aspect of the present invention, the vertical resonator can include a unit current aperture layer formed along at least a part of a circumference of each of the unit resonators, and the diameter of the emission region can be defined by an opening section of the unit current aperture layer.

In a surface-emitting type semiconductor laser in accordance with an exemplary aspect of the present invention, the respective unit resonators can be continuous, and a planar configuration of the vertical resonator can have anisotropy.

The planer configuration having anisotropy means that there are a major axis and a minor axis that intersect at right angles through the center of the planar configuration. In this instance, it is assumed that anisotropy is present in the direction of the major axis.

According to this surface-emitting type semiconductor laser, each of the unit resonators oscillates in a single-mode, and thus its polarization direction is in one direction. When these unit resonators are continuous and the vertical resonator has an anisotripic planar configuration, the polarization directions of laser light of the unit resonators can be aligned according to the anisotropy in the planar configuration of the vertical resonator. For this reason, according to the present surface-emitting type semiconductor laser, the polarization direction of laser light to be emitted can be controlled.

In a surface-emitting type semiconductor laser in accordance with an exemplary aspect of the present invention, the respective unit resonators can be continuous through a continuation region.

In a surface-emitting type semiconductor laser in accordance with an exemplary aspect of the present invention, a planar configuration of each of the unit resonators can have anisotropy.

According to the surface-emitting type semiconductor laser, each of the unit resonators oscillates in a single-mode, and thus its polarization direction is in one direction. Because the planar configuration of each of the unit resonators has anisotropy, polarization directions of laser light of the unit resonators can be aligned according to the anisotropy of the planar configuration of each of the unit resonators. For this reason, the polarization direction of laser light to be emitted is aligned. Specifically, according to the present surface-emitting type semiconductor laser, the polarization direction of laser light to be emitted can be controlled.

In a surface-emitting type semiconductor laser in accordance with an exemplary aspect of the present invention, each of the unit resonators can have the same diameter, and laser light of each of the unit resonators can have the same wavelength.

In a surface-emitting type semiconductor laser in accordance with an exemplary aspect of the present invention, the unit resonators can have at least two different diameters, and laser light generated by the unit resonators can have at least two different wavelengths.

In a surface-emitting type semiconductor laser in accordance with an exemplary aspect of the present invention, the vertical resonator can have an aperture section that reaches at least the unit current aperture layer.

In a surface-emitting type semiconductor laser in accordance with an exemplary aspect of the present invention, the aperture section can be embedded with insulation material.

A method for manufacturing a surface-emitting type semiconductor laser in accordance with an exemplary aspect of the present invention pertains to a method for manufacturing a surface-emitting type semiconductor laser having a vertical resonator above a substrate, and includes: stacking semiconductor layers to form at least a first mirror, an active layer and a second mirror over the substrate; and forming a vertical resonator having a columnar section by etching the semiconductor layers by using a mask layer. The vertical resonator is formed to have a plurality of unit resonators, and an emission region of each of the unit resonators is formed to have a diameter that oscillates in a single-mode.

The method for manufacturing a surface-emitting type semiconductor laser in accordance with an exemplary aspect of the present invention may further include forming a unit current aperture layer along at least a part of a circumference of the unit resonators.

A method for manufacturing a surface-emitting type semiconductor laser in accordance with an exemplary aspect of the present invention pertains to a method for manufacturing a surface-emitting type semiconductor laser having a vertical resonator above a substrate, and includes: stacking semiconductor layers to form at least a first mirror, an active layer and a second mirror over the substrate; forming aperture sections by etching the semiconductor layers; and forming current aperture layers near the active layer by oxidizing a part of the semiconductor layers through the aperture sections. The vertical resonator is formed to have a plurality of unit resonators. An emission region of each of the unit resonators is formed to have a diameter that oscillates in a single-mode, and the current aperture layer is formed along at least a part of a circumference of each of the unit resonators.

In the method for manufacturing a surface-emitting type semiconductor laser in accordance with an exemplary aspect of the present invention, the aperture sections can be disposed at intersections of longitudinal and transverse lines composing a lattice shape, and longitudinal and transverse pitch widths of the lattice shape can be different from one another.

DETAILED DESCRIPTION OF EXEMPLARY EMBODIMENTS

Exemplary embodiments of the present invention are described below with reference to the accompanying drawings.

1. First Exemplary Embodiment 1-1. Device Structure

Figure 1:
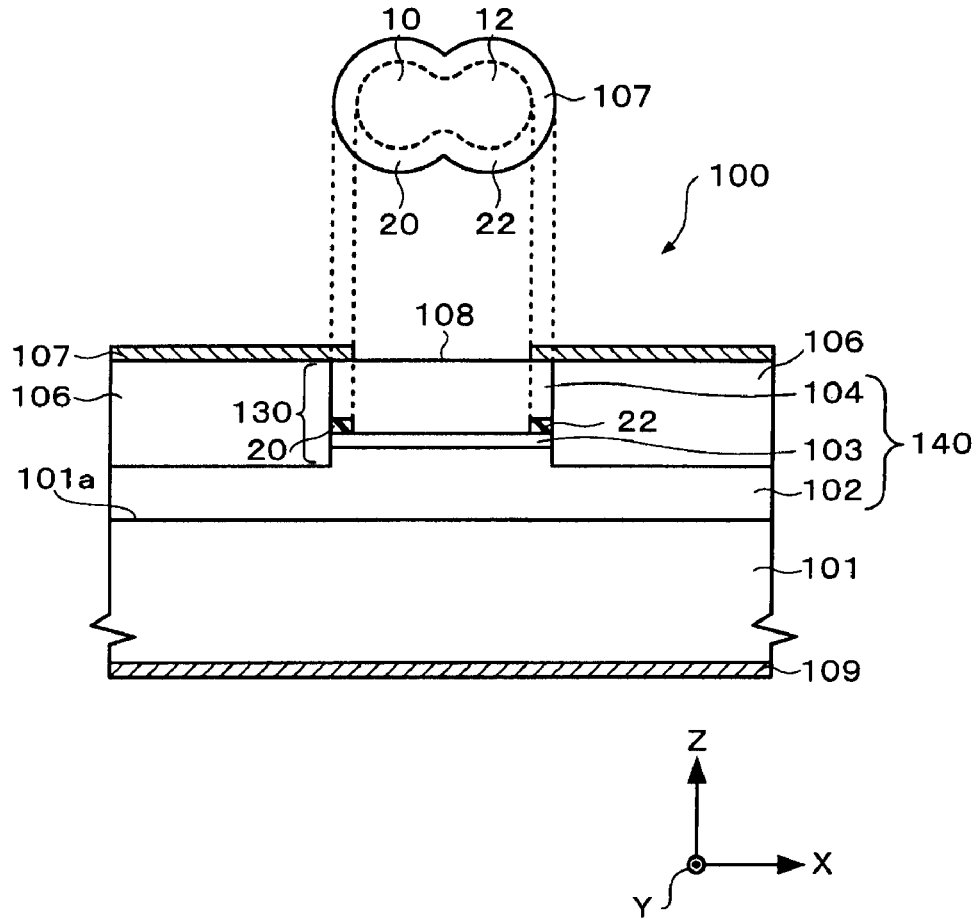
FIG. 1 is a schematic of a surface-emitting type semiconductor laser in accordance with a first exemplary embodiment of the present invention.

FIG. 1 is a schematic of a surface-emitting type semiconductor laser (hereinafter "surface emitting laser") 100 in accordance with a first exemplary embodiment of the present invention. FIG. 2-FIG. 5 schematically show plan views of major portions of the surface-emitting laser 100 of the first exemplary embodiment.

The surface emitting laser 100 according to the present exemplary embodiment shown in FIG. 1 includes a semiconductor substrate (a GaAs substrate in the present exemplary embodiment) 101, a vertical resonator 140 formed on the semiconductor substrate 101, a first electrode 107 and a second electrode 109. The vertical resonator 140 includes a first mirror 102, an active layer 103, and a second mirror 104.

Next, components of the surface-emitting laser 100 are described below.

The vertical resonator 140 may be formed, for example, from the first mirror 102 that is a distributed reflection type multilayer mirror of 40 pairs of alternately laminated n-type $Al_{0.9}Ga_{0.1}As$ layers and n-type $Al_{0.15}Ga_{0.85}As$ layers, the active layer 103 composed of GaAs well layers and $Al_{0.3}Ga_{0.7}As$ barrier layers in which the well layers include a quantum well structure composed of three layers, and the second mirror 104 that is a distributed reflection type multilayer mirror of 25 pairs of alternately laminated p-type $Al_{0.9}Ga_{0.1}As$ layers and p-type $Al_{0.15}Ga_{0.85}As$ layers, which are successively stacked in layers. It is noted that the composition of each of the layers and the number of the layers forming the first mirror 102, the active layer 103 and the second mirror 104 are not limited to the above.

The second mirror 104 is made to be p-type, for example, by doping C, Zn or Mg, and the first mirror 102 is made to be n-type, for example, by doping Si or Se. Accordingly, the second mirror 104, the active layer 103 in which no impurity is doped, and the first mirror 102 form a pin diode.

In accordance with the present exemplary embodiment, the vertical resonator 140 includes a semiconductor deposited body in a pillar shape (hereafter "first columnar section") 130, and the side surface of the columnar section 130 is covered with an insulation layer 106. The columnar section 130 refers to a part of the vertical resonator 140, and a semiconductor deposited body in a columnar shape including at least the second mirror 104.

The planar configuration of the vertical resonator 140 has anisotropy. The planer configuration having anisotropy means that there are a major axis and a minor axis that intersect at right angles through the center of the planar configuration. In this instance, it is assumed that anisotropy is present in the direction of the major axis. This similarly applies to exemplary embodiments to be described below. Specifically, the planer configuration having anisotropy may be a configuration, for example, as shown in FIG. 1, where a plurality (two in the example shown in FIG. 1) of circles are connected with one another with parts thereof being overlapped, or the like.

The vertical resonator 140 has a plurality (two in the example shown in FIG. 1) of unit resonators 10 and 12. Each of the unit resonators 10 and 12 functions as an independent resonator. Specifically, each of the unit resonators 10 and 12 can emit its own inherent laser light.

Figure 2:
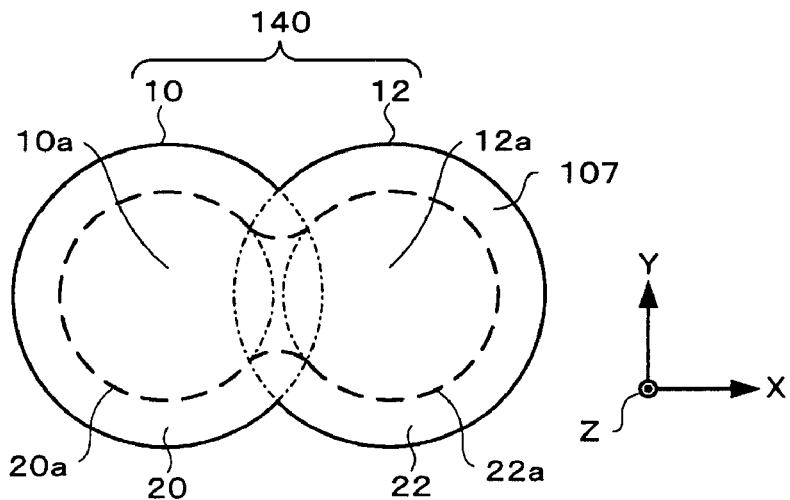
FIG. 2 is a schematic of a portion of the surface-emitting type semiconductor laser of the first exemplary embodiment.

Specifically, as shown in FIG. 2, the vertical resonator 140 is formed from a first unit resonator 10 and a second unit resonator 12. The two unit resonators 10 and 12 are directly continued with one another. When viewed in an X-Y plane, the two circular unit resonators 10 and 12 have portions overlapping with one another. The vertical resonator 140 has anisotropy. In the example of FIG. 2, the vertical resonator 140 has anisotropy in the X-axis direction.

A first unit current aperture layer 20 is formed in a region near the active layer 103 among layers composing the first unit resonator 10. A second unit current aperture layer 22 is formed in a region near the active layer 103 among layers composing the second unit resonator 20. The first and second unit current aperture layers 20 and 22 have a cross section, when cut in a plane parallel with the X-Y plane in FIG. 1, in the shape that conforms to the circumference of the columnar section 130. In other words, the first unit current aperture layer 20 has an X-Y cross section in the shape that conforms to a part of the circumference of the first unit resonator 10. The second unit current aperture layer 22 has an X-Y cross section in the shape that conforms to a part of the circumference of the second unit resonator 12. In the example shown in FIG. 1, the planar configuration of each of the first and second unit current aperture layers 20 and 22 is generally a circular ring shape with a section thereof being cut. These ring shapes are continuous with one another at their partially cut sections. The first and second unit current aperture layers 20 and 22 have opening sections 20a and 22a, respectively. The first and second unit current aperture layers 20 and 22 may be composed of aluminum oxide, for example.

Each of emission regions 10a and 12a of the respective unit resonators 10 and 12 has a diameter that oscillates in a single-mode. The diameters of the respective emission regions 10a and 12a are determined by the opening sections 20a and 22a of the respective unit current aperture layers 20 and 22. This similarly applies to exemplary embodiments to be described below. For example, in the example shown in FIG. 2, the diameter of the emission region 10a of the first unit resonator 10 corresponds to the diameter of the circular opening section 20a of the first unit current aperture layer 20, and the diameter of the emission region 12a of the second unit resonator 12 corresponds to the diameter of the circular opening section 22a of the second unit current aperture layer 22. The diameter that oscillates in a single-mode is appropriately decided depending on the position and thickness of each of the unit current aperture layers 20 and 22, and wavelength, and may be, for example, 4-4 m or less.

In the surface-emitting laser 100 in accordance with the present exemplary embodiment, the insulation layer 106 is formed to cover side surfaces of the second mirror 104, the active layer 103 and the first mirror 102, and the upper surface of the first mirror 102. For example, polyimide resin, fluorine resin, acrylic resin, epoxy resin, etc. can be used as the resin that composes the embedding insulating layer 106. In particular, the resin may be polyimide resin or fluorine resin in view of their easiness of processing and nonconductivity.

A first electrode 107 is formed on the columnar section 130 and the insulation layer 106. Furthermore, a part where the first electrode 107 is not formed (an opening section) is provided in the central area of the upper surface of the columnar section 130. This part defines an emission region of laser light. The first electrode 107 includes a multilayer film of Au and an alloy of Au and Zn, for example. Further, a second electrode 109 is formed on the lower surface of the semiconductor substrate 101. The second electrode 109 includes a multilayer film of Au and an alloy of Au of Ge, for example. In the surface-emitting laser 100 shown in FIG. 1, on the columnar section 130, the first electrode 107 connects to the second mirror 104, and the second electrode 109 connects to the first mirror 102 through the semiconductor substrate 101. An electric current is injected into the active layer 103 by the first electrode 107 and the second electrode 109.

The materials to form the first and second electrodes 107 and 109 are not limited to those described above, and, for example, metals, such as Cr, Ti, Ni, Au or Pt and these alloys, etc. can be used depending on the requirements for adhesion enforcement, diffusion prevention or anti-oxidation, etc.

Figure 3:
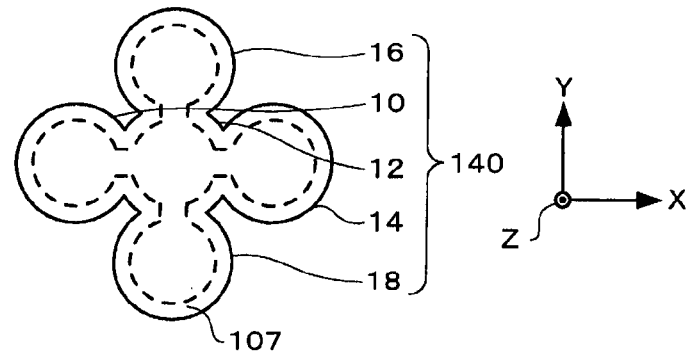
FIG. 3 is a schematic of a portion of the surface-emitting type semiconductor laser of the first exemplary embodiment.

In the example shown in FIG. 1 and FIG. 2, the vertical resonator 140 has two unit resonators 10 and 12. However, the vertical resonator 140 can have a plurality of unit resonators. For example, as shown in FIG. 3, the vertical resonator 140 can have five unit resonators 10, 12, 14, 16 and 18. In the example in FIG. 3, three of the unit resonators 10, 12 and 14 are continuous in the X-direction, and three of the unit resonators 10, 16 and 18 are continuous in the Y-direction, such that the vertical resonator 140 has anisotropy in two directions, specifically, the X-direction and the Y-direction.

Figure 4:
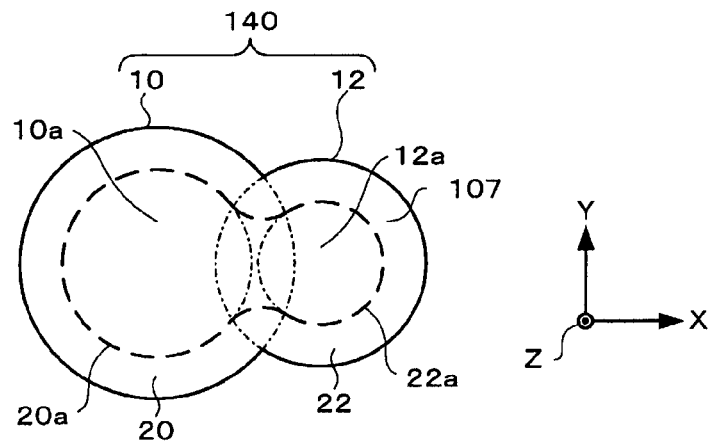
FIG. 4 is a schematic of a portion of the surface-emitting type semiconductor laser of the first exemplary embodiment.

Also, in the example shown in FIG. 1 and FIG. 2, the diameter of the emission region 10*a* of the first unit resonator 10 and the diameter of the emission region 12*a* of the second unit resonator 12 have the same length. However, for example, as shown in FIG. 4, the diameter of the emission region 10*a* of the first unit resonator 10 and the diameter of the emission region 12*a* of the second unit resonator 12 can have different lengths. When the diameter of the emission regions 10*a* and 12*a* has the same length, laser light that is emitted from each of the emission regions 10*a* and 12*a* has the same wavelength. However, when the diameters of the emission regions 10*a* and 12*a* have different lengths, laser light that is emitted from the respective emission regions 10*a* and 12*a* have different wavelengths. In other words, in the example shown in FIG. 4, the diameter of each of the emission regions 10*a* and 12*a* is set such that the wavelengths of laser light emitted from the respective emission regions 10*a* and 12*a* are different from one another. The reason why the wavelength of emitted laser light is different depending on the diameter of each emission region is that the electric resistance differs depending on the diameter (larger or smaller) of the emission region. Specifically, because the smaller the diameter of the emission region, the greater the electric resistance and the greater the heat generated therefrom, compared to an emission region having a larger diameter, the laser light shifts to the long-wavelength side, and the two emit laser light having different wavelengths.

Figure 5:
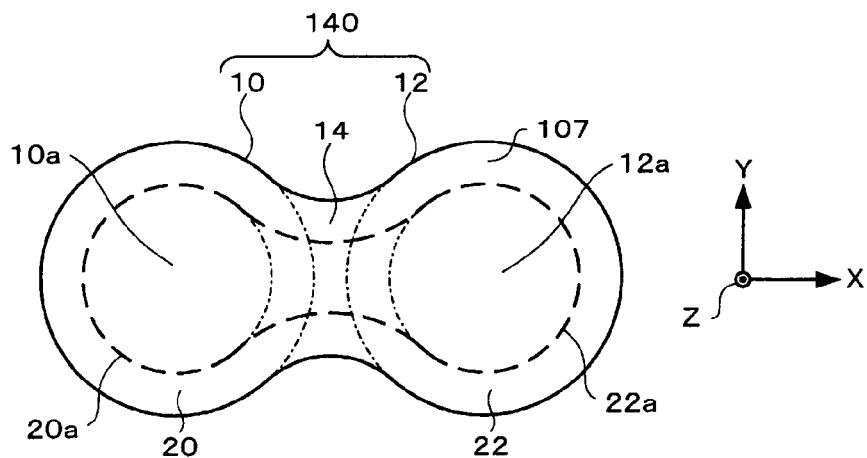
FIG. 5 is a schematic of a portion of the surface-emitting type semiconductor laser of the first exemplary embodiment.

Moreover, in the example in FIG. 1 and FIG. 2, the first unit resonator 10 and the second unit resonator 12 are directly made continuous. However, for instance, the first unit resonator 10 and the second unit resonator 12 may be made continuous through a continuation region 14, as shown in FIG. 5.

Figure 6:
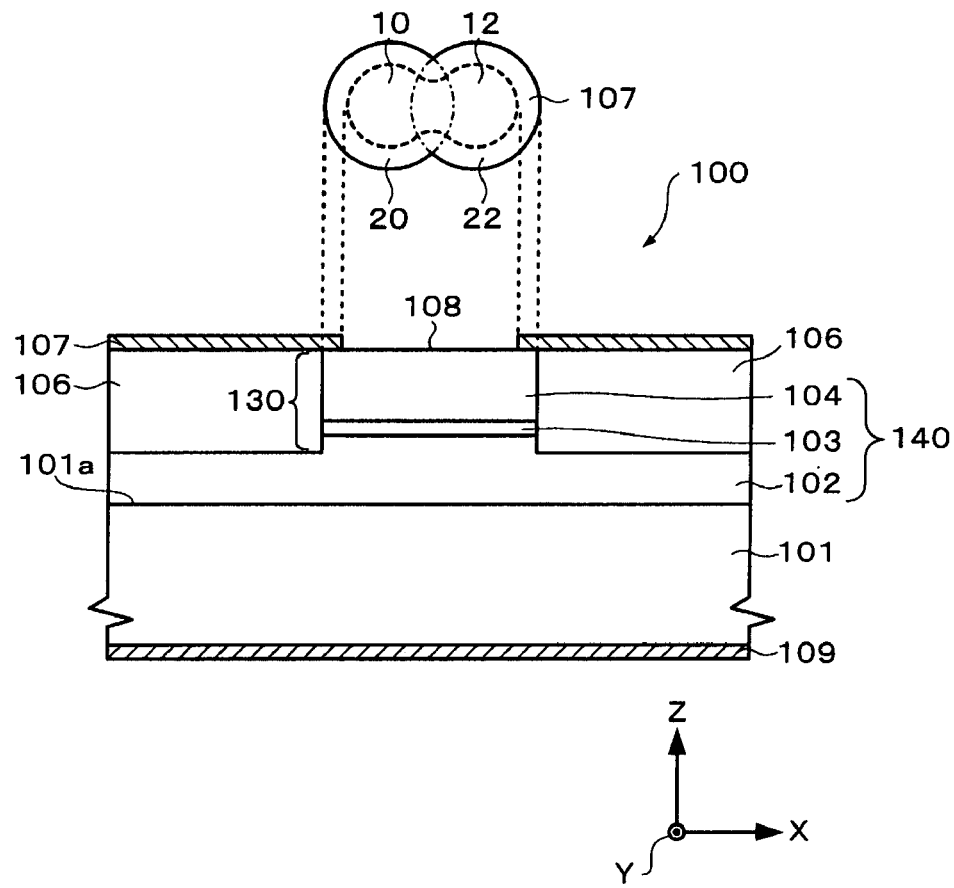
FIG. 6 is a schematic of a surface-emitting type semiconductor laser relating to the first exemplary embodiment of the present invention.

Also, in the example described with respect to FIG. 1, the unit resonators 10 and 12 have the unit current aperture layers 20 and 22, respectively. However, as shown in FIG. 6, the unit resonators 10 and 12 can be formed without any unit current aperture layers. In this case, the diameter of each of the emission regions 10*a* and 12*a* of the unit resonators 10 and 12 is defined by the external configuration of each of the respective unit resonators 10 and 12.

1-2 Operation of Device

General operations of the surface-emitting type semiconductor laser 100 of the present exemplary embodiment are described below. It is noted that the following method for driving the surface-emitting type semiconductor laser 100 is described as an example, and various changes can be made without departing from the subject matter of the present invention.

When applying a voltage in a forward direction to the pin diode across the first electrode 107 and the second electrode 109, recombination of electrons and holes occur in the active layer 103, thereby causing emission of light due to the recombination. Stimulated emission occurs during the period the generated light reciprocates between the second mirror 104 and the first mirror 102, whereby the light intensity is amplified. When the optical gain exceeds the optical loss, laser oscillation occurs, whereby laser light is emitted from the emission surface 108 that is present on the upper surface of the second columnar section 130 in a direction perpendicular (in the Z-direction indicated in FIG. 1) to the semiconductor substrate 101. It is noted here that the "direction perpendicular to the semiconductor substrate 101" corresponds to a direction perpendicular (Z-direction in FIG. 1) to a surface 101*a* (a plane parallel with the X-Y plane in FIG. 1) of the semiconductor substrate 101.

In the surface-emitting type semiconductor laser 100 of the present exemplary embodiment, the vertical resonator 140 has a plurality of unit resonators 10 and 12, and each of the emission regions 10*a* and 12*a* of the respective unit resonators 10 and 12 has a diameter that oscillates in a single-mode. Further, the unit resonators 10 and 12 are continuous with one another, and the planar configuration of the vertical resonator 140 has anisotropy. Each of the unit resonators 10 and 12 causes laser oscillation in a single-mode, and therefore its polarization direction is in one direction. Due to the fact that the unit resonators 10 and 12 are continuous, and the planar configuration of the vertical resonator 140 has anisotropy, the polarization directions of the unit resonators 10 and 12 can be aligned according to the anisotropy of the planar configuration of the vertical resonator 140. For this reason, the polarization directions of laser light emitted are aligned. Specifically, laser light is emitted with its polarization direction controlled. More specifically, the polarization directions are aligned in the minor axis direction; for example, in the example shown in FIG. 1, the polarization directions are aligned in the Y-direction.

In the surface-emitting type semiconductor laser 100 in accordance with the present exemplary embodiment, as shown in FIG. 2, FIG. 3 or FIG. 5, when the unit resonators 10 and 12 have the same diameter, laser light generated by the unit resonators 10 and 12 have the same wavelength, resulting in oscillation in a single-mode as a whole. When the unit resonators 10 and 12 have different diameters, as shown in FIG. 4, laser light generated by the respective unit resonators 10 and 12 have different wavelengths, resulting in oscillation in a multimode as a whole.

1-3 Device Manufacturing Method

Next, an example of a method of manufacturing the surface-emitting type semiconductor laser 100 in accordance with a first exemplary embodiment of the present invention will be described with reference to FIG. 7 to FIG. 10. FIG. 7 to FIG. 10 are schematics showing the method of manufacturing the surface-emitting type semiconductor laser 100 according to the present exemplary embodiment shown in FIG. 1, each of which corresponds to the cross section shown in FIG. 1.

Figure 7:
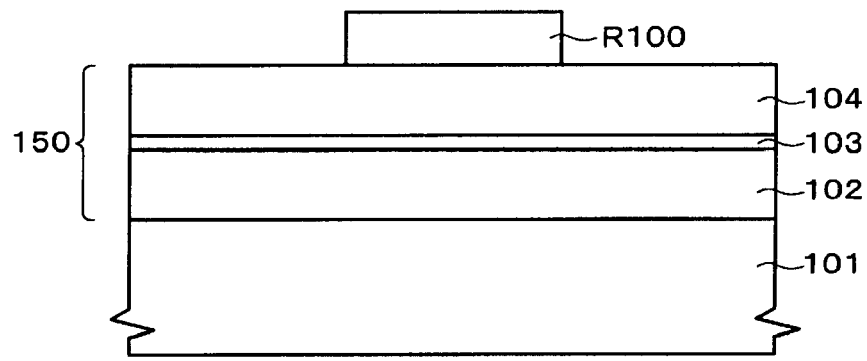
FIG. 7 is a schematic showing a step of manufacturing the surface-emitting type semiconductor laser in accordance with the first exemplary embodiment.

(1) First, on the surface of the semiconductor substrate 101 composed of n-type GaAs, a semiconductor multilayer film 150, shown in FIG. 7, is formed by epitaxial growth while modifying its composition. It is noted here that the semiconductor multilayer film 150 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, and a second mirror 104 of 25 pairs of alternately laminated p-type $Al_{0.9}Ga_{0.1}As$ layers and p-type $Al_{0.15}Ga_{0.85}As$ layers. These layers are successively stacked in layers on the semiconductor substrate 101 to thereby form the semiconductor multilayer film 150.

When growing the second mirror 104, at least one layer thereof adjacent to the active layer 103 is formed as an AlAs layer or an AlGaAs layer that is later oxidized and becomes current aperture layers 20 and 22 (see FIG. 1). Also, the uppermost surface layer of the second mirror 104 may preferably be formed to have a high carrier density such that ohm contact can be readily made with an electrode (first electrode 107).

The temperature at which the epitaxial growth is conducted is appropriately decided depending on the growth method, the kind of raw material, the type of the semiconductor substrate 101, and the kind, thickness and carrier density of the semiconductor multilayer film 150 to be formed, and in general may be 450° C.-800° C. Also, the time required for conducting the epitaxial growth is appropriately decided like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 8:
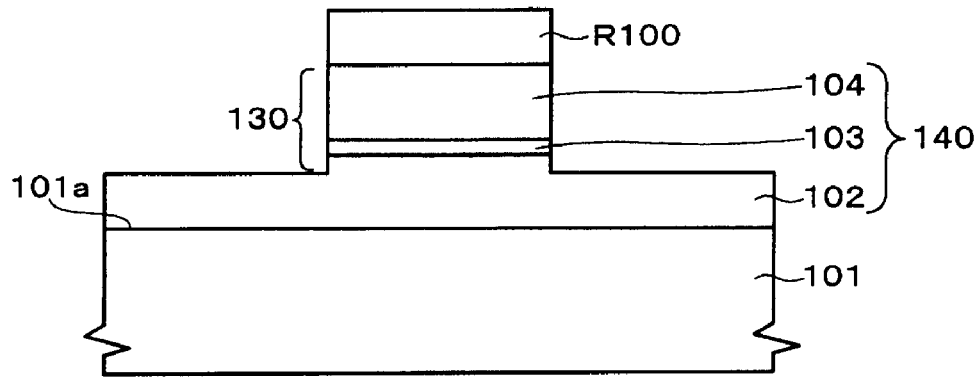
FIG. 8 is a schematic showing a step of manufacturing the surface-emitting type semiconductor laser in accordance with the first exemplary embodiment.
Figure 9:
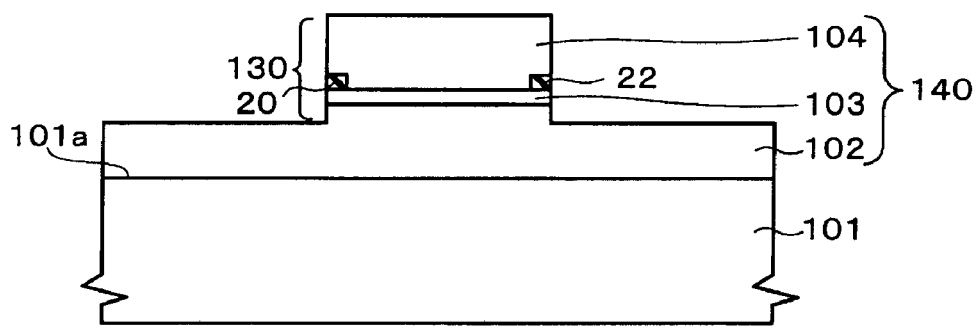
FIG. 9 is a schematic showing a step of manufacturing the surface-emitting type semiconductor laser in accordance with the first exemplary embodiment.

Next, resist is coated on the semiconductor multilayer film 150. Then the resist is patterned by a photolithography method, thereby forming a first mask layer R100 having a specified pattern, as shown in FIG. 7. The first mask layer R100 is formed above an area where a columnar section 130 (see FIG. 1) is to be formed. The first mask layer R100 is formed in a manner that its planar configuration has anisotropy. As a result, the columnar section 130 is formed such that its planar configuration has anisotropy. Next, by using the first mask layer R100 as a mask, the second mirror 104, the active layer 103, and a part of the first mirror 102 are etched by, for example, a dry etching method, thereby forming a columnar section 130, as shown in FIG. 8. Then, the first mask layer R100 is removed.

By the steps described above, a vertical resonator 140 including the columnar section 130 is formed on the semiconductor substrate 101, as shown in FIG. 8.

Next, by placing the semiconductor substrate 101 on which the vertical resonator 140 is formed through the aforementioned steps in a water vapor atmosphere at about 400° C., for example, the layer having a high Al composition (a layer with an Al composition being 0.95 or higher) provided in the second mirror 104 is oxidized from its side surface, thereby forming the current aperture layers 20 and 22. The oxidation rate depends on the temperature of the furnace, the amount of water vapor supply, and the Al composition and the film thickness of the layer to be oxidized.

By the steps described above, a portion that functions as a light emitting element (excluding first and second electrodes 107 and 109) in the surface-emitting laser 100 is formed.

(2) Next, an embedding insulation layer 106 that surrounds a part of the first mirror 102, the active layer 103 and the second mirror 104 is formed (see FIG. 1).

Here, the case in which polyimide resin is used as a material to form the embedding insulation layer 106 will be described. First, a resin precursor (polyimide precursor) is coated on the vertical resonator 140 by using, for example, a spin coat method, to thereby form a resin precursor layer. In this instance, the resin precursor layer is formed such that its film thickness is greater than the height of the columnar section 130. As the method of forming the resin precursor layer, another known technique, such as, a dipping method, a spray coat method, an ink jet method or the like can be used, besides the aforementioned spin coat method.

Figure 10:
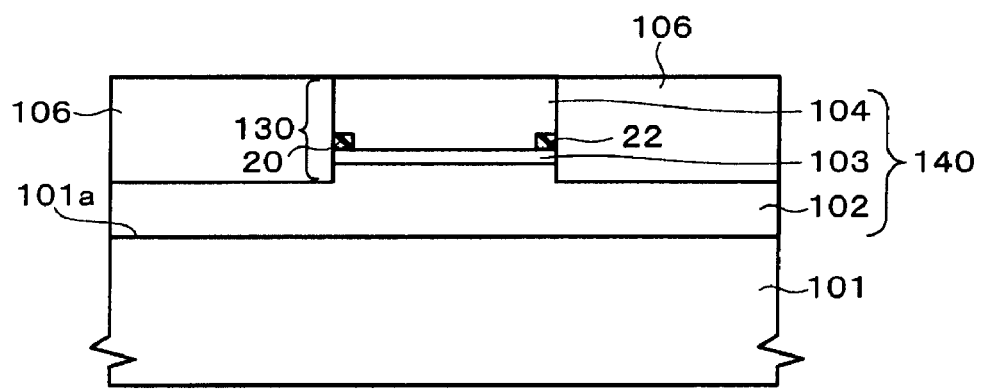
FIG. 10 is a schematic showing a step of manufacturing the surface-emitting type semiconductor laser in accordance with the first exemplary embodiment.

Then, the substrate is heated by using, for example, a hot plate or the like, thereby removing the solvent. Then the resin precursor layer is imidized in the furnace at about 350° C., such that the embedding insulation layer 106 that is almost completely set is formed. Next, as shown in FIG. 10, the upper surface of the columnar section 130 is exposed. As a method for exposing the upper surface of the columnar section 130, a CMP method, dry etching method, wet etching method or the like can be used.

(3) Next, forming a first electrode 107 and a second electrode 109 to inject an electric current into the active layer 103, and an emission surface 108 of laser light (see FIG. 1) are described.

Prior to forming the first electrode 107 and the second electrode 109, an exposed upper surface of the columnar section 130 and an exposed lower surface of the semiconductor substrate 101 may be washed by using a plasma treatment method, or the like, depending on the requirements. As a result, a device of more stable characteristics can be formed. Then, for example, a multilayer film of Au and an alloy of Au and Zn, is formed by, for example, a vacuum deposition method on the upper surface of the embedding insulation layer 106 and the columnar section 130, and then a portion where the multilayer film is not formed is formed on the upper surface of the columnar section 130 by a lift-off method. This portion becomes an emission surface 108. It is noted that, in the above step, a dry etching method or a wet etching method can be used instead of the lift-off method.

Also, a multilayer film of Au and an alloy of Au and Ge, for example, is formed by, for example, a vacuum deposition method on the lower surface of the semiconductor substrate 101 which is exposed. Next, an annealing treatment is conducted. The temperature of the annealing treatment depends on the electrode material. This is usually conducted at about 400° C. for the electrode material used in the present exemplary embodiment. By the steps described above, the first electrode 107 and the second electrode 109 are formed.

By the process described above, the surface-emitting type semiconductor laser 100 shown in FIG. 1 can be obtained.

According to the example in the step (1) described above, when growing the second mirror 104, an AlAs layer or an AlGaAs layer that is later oxidized and becomes the current aperture layers 20 and 22 is formed. However, a surface-emitting type semiconductor laser 100 in which the columnar section 130 does not include a current aperture layer, as shown in FIG. 6, may be obtained by not forming the AlAs layer or AlGaAs layer.

1-4. Functions and Effect

Main functions and effect of the surface-emitting type semiconductor laser 100 in accordance with the present exemplary embodiment are described below.

In the surface-emitting type semiconductor laser 100 of the present exemplary embodiment, the vertical resonator 140 has a plurality of unit resonators 10 and 12, and each of the emission regions 10a and 12a of the respective unit resonators 10 and 12 has a diameter that oscillates in a single-mode. Further, the unit resonators 10 and 12 are continuous with one another, and the planar configuration of the vertical resonator 140 has anisotropy. Since each of the unit resonators 10 and 12 oscillates in a single-mode, its polarization direction is in one direction. Due to the fact that the unit resonators 10 and 12 are continuous, and the planar configuration of the vertical resonator 140 has anisotropy, the polarization directions of laser light of the unit resonators 10 and 12 can be aligned according to the anisotropy of the planar configuration of the vertical resonator 140. For this reason, the polarization directions of laser light emitted are aligned. In other words, in accordance with the surface-emitting type semiconductor laser 100 of the present exemplary embodiment, the polarization direction of laser light to be emitted can be controlled.

Also, according to the surface-emitting type semiconductor laser 100 in accordance with the present exemplary embodiment, either in single-mode oscillation or multimode oscillation of laser light, the emission pattern can be formed into an optional shape by controlling the planar configuration, number and arrangement of unit emission regions. For this reason, the present exemplary embodiment can be extensively employed in light sources of laser printers, sensors and the like.

2. Second Exemplary Embodiment 2-1 Device Structure

Figure 11:
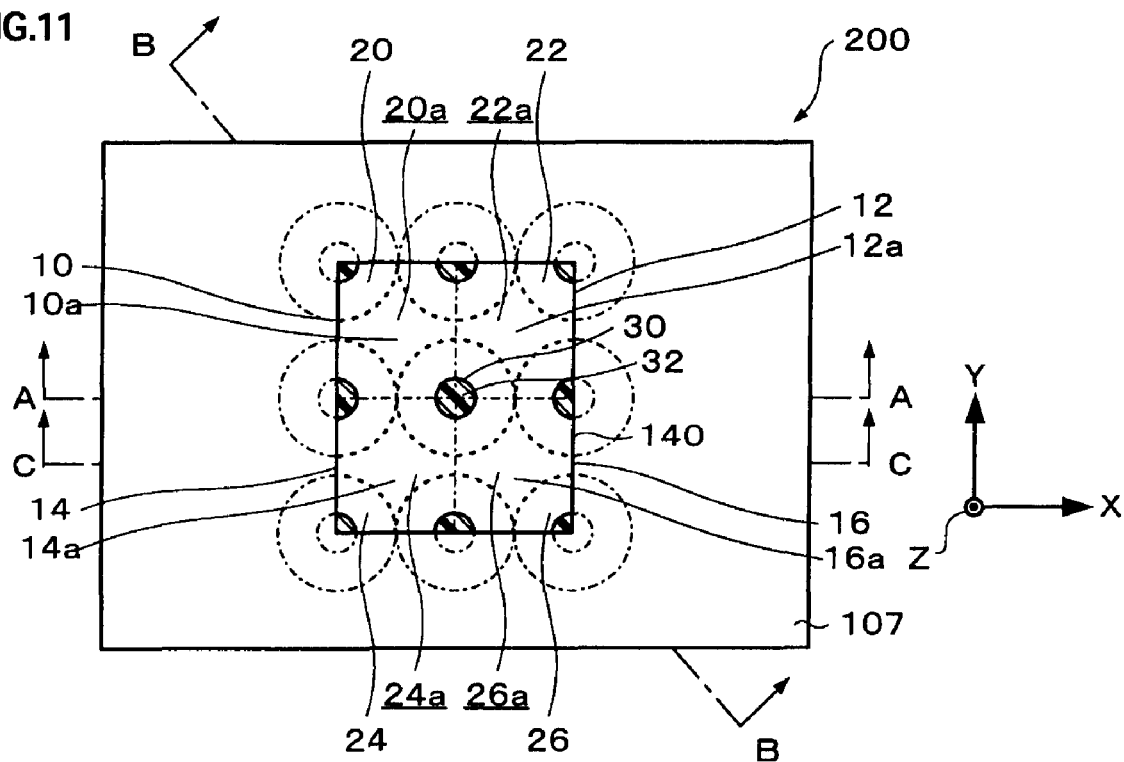
FIG. 11 is a schematic of a surface-emitting type semiconductor laser in accordance with a second exemplary embodiment of the present invention.
Figure 12:
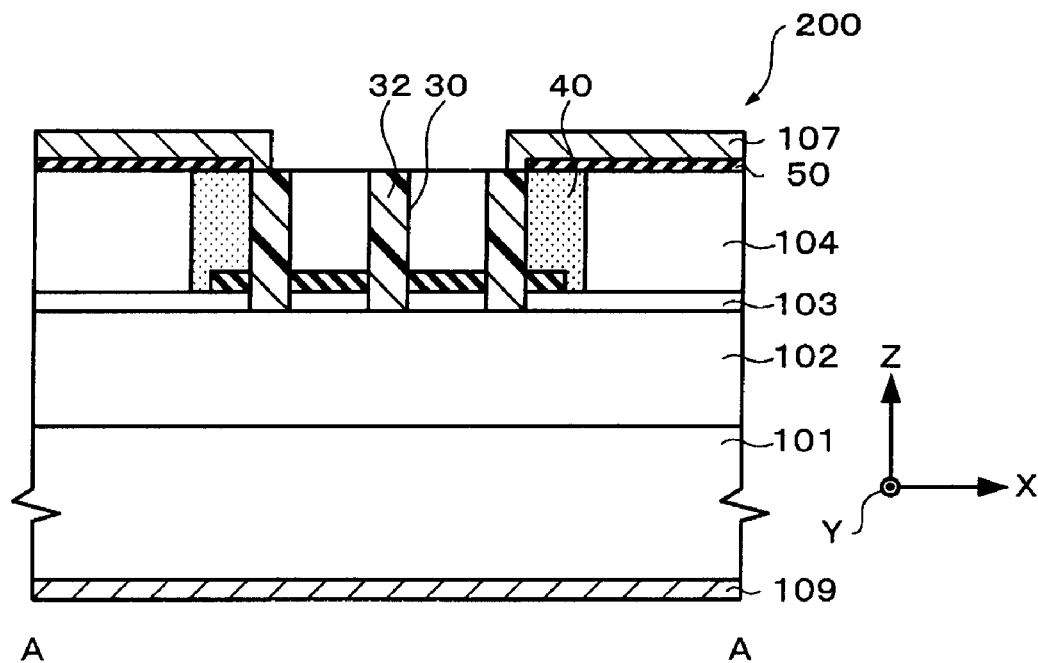
FIG. 12 is a cross-sectional schematic taken along plane A-A of the surface-emitting type semiconductor laser of the second exemplary embodiment shown in FIG. 11.
Figure 13:
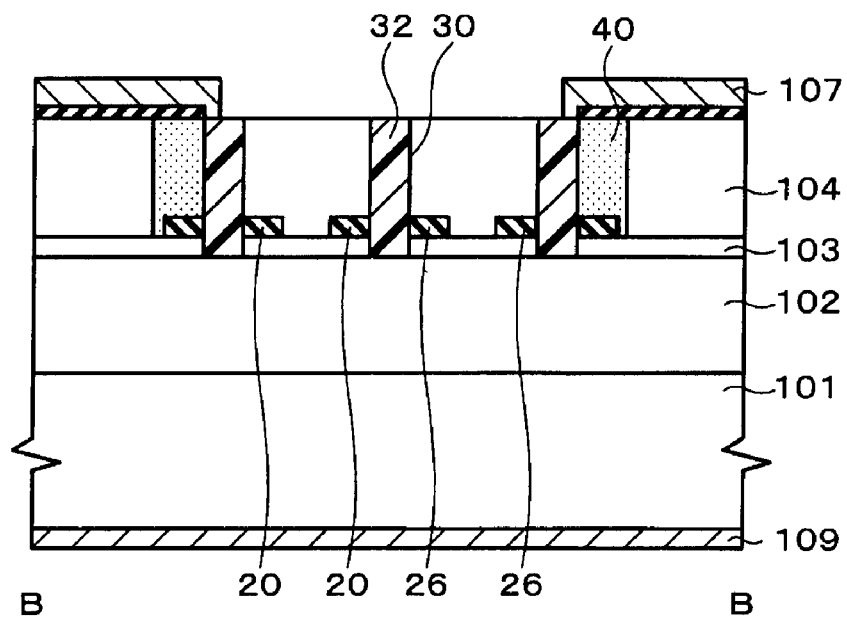
FIG. 13 is a cross-sectional schematic taken along plane B-B of the surface-emitting type semiconductor laser of the second exemplary embodiment shown in FIG. 11.
Figure 14:
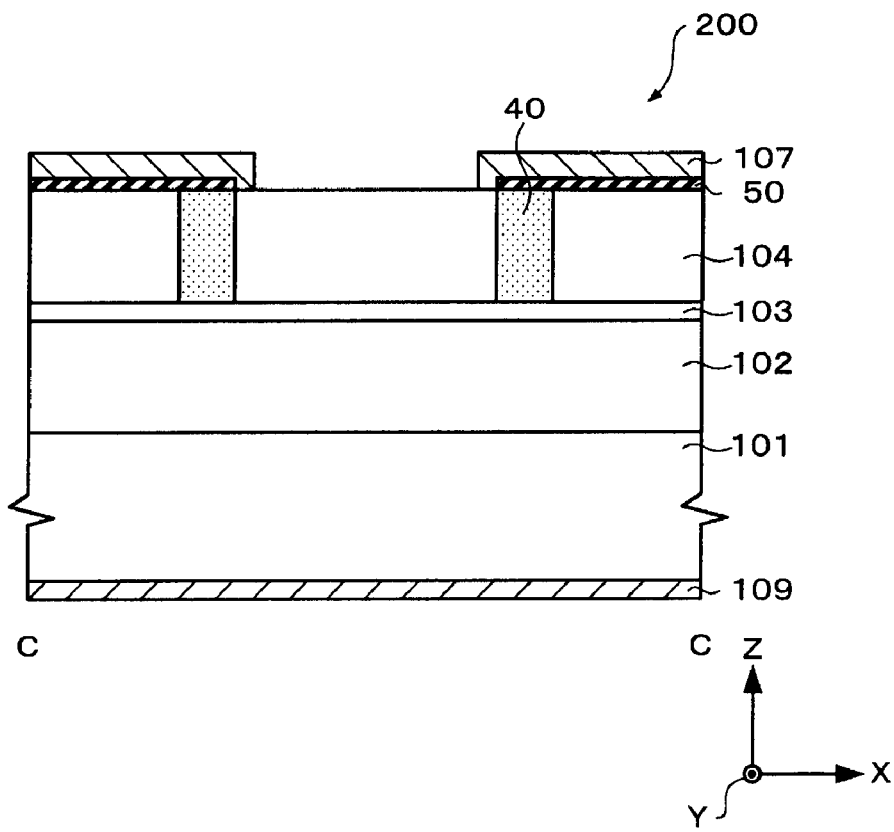
FIG. 14 is a cross-sectional schematic taken along plane C-C of the surface-emitting type semiconductor laser of the second exemplary embodiment shown in FIG. 11.
Figure 15:
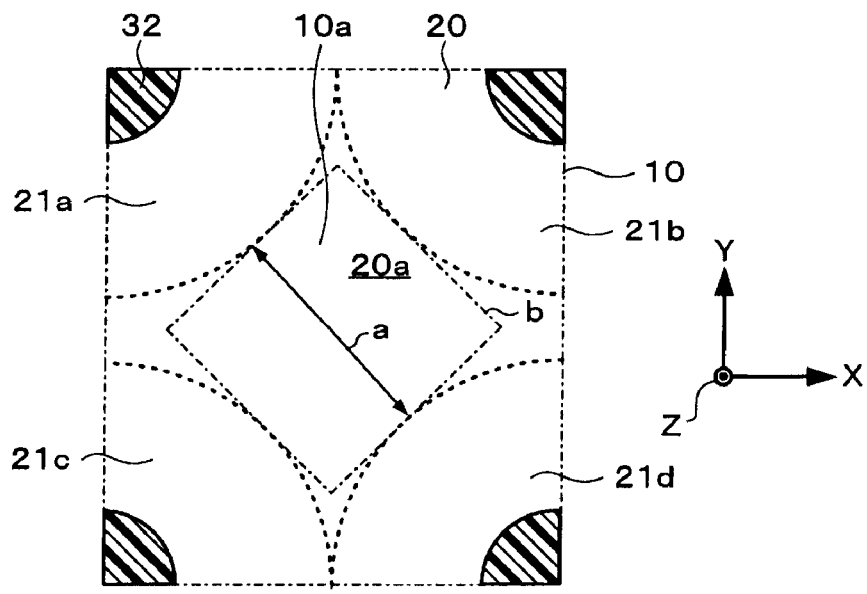
FIG. 15 schematic of a portion of the surface-emitting type semiconductor laser of the second exemplary embodiment.

FIG. 11 is a schematic of a surface emitting laser 200 in accordance with a second exemplary embodiment of the present invention. FIG. 12-FIG. 14 are schematics show cross-sectional views of the surface-emitting laser 200 taken along planes A-A, lines B-B and lines C-C in FIG. 11, respectively. FIG. 15 is a schematic of major portions of the surface-emitting laser 200 in accordance with the second exemplary embodiment. The same reference numerals are appended to components that have substantially the same functions as those of the surface-emitting laser 100 in accordance with the first exemplary embodiment, and their detailed description is omitted.

As shown in FIG. 11-FIG. 14, the surface-emitting laser 200 of the present exemplary embodiment includes a semiconductor substrate (a GaAs substrate in the present exemplary embodiment) 101, a vertical resonator 140 formed on the semiconductor substrate 101, a first electrode 107, and a second electrode 109. The vertical resonator 140 includes a first mirror 102, an active layer 103, and a second mirror 104.

Next, components of the surface-emitting laser 200 are described below.

The vertical resonator 140 of the present exemplary embodiment has a plurality (four in the example shown in FIG. 11) of unit resonators 10, 12, 14 and 16. Each of the unit resonators 10, 12, 14 and 16 functions as an independent resonator. Each of the unit resonators 10, 12, 14 and 16 can emit its own inherent laser light.

Specifically, as shown in FIG. 11, the vertical resonator 140 is formed from a first unit resonator 10, a second unit resonator 12, a third unit resonator 14, and a fourth unit resonator 16. The planar configuration of each of the unit resonators 10, 12, 14 and 16 has anisotropy. In the example shown in FIG. 11, the planar configuration of each of the unit resonators 10, 12, 14 and 16 is formed to be rectangular having long sides in the longitudinal direction (Y-direction in FIG. 11), and each of the unit resonators 10, 12, 14 and 16 has anisotropy in the Y-axis direction.

The vertical resonator 140 has a plurality (nine in the example of FIG. 11) of aperture sections 30. The planar configuration of the aperture section 30 is circular, for example, as shown in FIG. 11. The planar configuration of each of the aperture sections 30 of each of the unit resonators 10, 12, 14 and 16 is divided by borders of the unit resonators 10, 12, 14 and 16, and for example, is a ¼ circle in the example of FIG. 11. Further, each of the unit resonators 10, 12, 14 and 16 has four aperture sections 30 each in the form of a ¼ circle at the four corners of its rectangular configuration, as viewed in a plan view. The aperture sections are embedded with embedding insulation layers 32. The embedding insulation layers 32 can be composed of, for example, polyimide resin. It is noted that although the shape of each aperture section 30 in a region of each of the unit resonators 10, 12, 14 and 16 is in the form of a ¼ circle, but the planar configuration of the aperture section 30 is circular when the concept of the unit resonators 10, 12, 14 and 16 is disregarded.

In accordance with the present exemplary embodiment, a first unit current aperture layer 20 is formed in a region near the active layer 103 among layers composing the first unit resonator 10. A second unit current aperture layer 22 is formed in a region near the active layer 103 among layers composing the second unit resonator 12. A third unit current aperture layer 24 is formed in a region near the active layer 103 among layers composing the third unit resonator 14. Also, a fourth unit current aperture layer 26 is formed in a region near the active layer 103 among layers composing the fourth unit resonator 16.

The first unit current aperture layer 20 has an X-Y cross section in a shape that conforms to a part of the circumference of the first unit resonator 10. The second unit current aperture layer 22 has an X-Y cross section in the shape that conforms to a part of the circumference of the second unit resonator 12. The third unit current aperture layer 24 has an X-Y cross section in the shape that conforms to a part of the circumference of the third unit resonator 14. The fourth unit current aperture layer 26 has an X-Y cross section in the shape that conforms to a part of the circumference of the fourth unit resonator 16. In other words, each of the first through fourth unit current aperture layers 20, 22, 24 and 26 has a cross section, when cut in a plane parallel with the X-Y plane in FIG. 12 or FIG. 13, in the shape that is a quarter of a ring shape concentric with the aperture section 30 described above. The first through fourth unit current aperture layers 20, 22, 24 and 26 may be composed of aluminum oxide, for example. It is noted that, although each of the first through fourth unit current aperture layers 20, 22, 24 and 26 is in the form of a quartered ring shape, the planar configuration of each of the current aperture layers is a ring shape when the concept of the unit resonators 10, 12, 14 and 16 is disregarded.

The above is more concretely described with reference to FIG. 15 that shows an enlarged view of only the unit resonator 10. The planar configuration of the unit resonator 10 is a rectangle, and the embedding insulation layer 32 is arranged on the four corners thereof. The planar configuration of the embedding dielectric layer 32 is a ¼ circle. The unit current aperture layer 20 is formed around the embedding insulation layer 32. The unit current aperture layer 20 is formed from four insulation layers 21a, 21b, 21c, and 21d. The planar configuration of each of the four insulation layers 21a, 21b, 21c, and 21d has a ¼ ring shape that is concentric with the embedding insulation layer 32. Outer circular arcs of these four insulation layers 21a, 21b, 21c, and 21d define an external shape of an opening section 20a of the unit current aperture layer 20. The opening section 20a defines an emission region 10a of the unit resonator 10.

Each of the emission regions 10a, 12a, 14a and 16a of the respective unit resonators 10, 12, 14 and 16 has a size that oscillates in a single-mode. The size of each of the emission regions 10a, 12a, 14a, and 16a is defined by each of the opening sections 20a, 22a, 24a and 26a of the respective unit current aperture layers 20, 22, 24 and 26. For example, in the example shown in FIG. 11, the size of the emission region 10a of the first unit resonator 10 corresponds to the size of the opening section 20a of the first unit current aperture layer 20, the size of the emission region 12a of the second unit resonator 12 corresponds to the size of the opening section 22a of the second unit current aperture layer 22, the size of the emission region 14a of the third unit resonator 14 corresponds to the size of the opening section 24a of the third unit current aperture layer 24, and the size of the emission region 16a of the fourth unit resonator 16 corresponds to the size of the opening section 26a of the fourth unit current aperture layer 26. The size of the opening section 20a can be, for example, the length of a line segment a indicated by an arrow in FIG. 15. The length of the line segment a can be, for example, the length of each side of a square b that circumscribes the ¼ circles that define the planar configuration of the four insulation layers 21a, 21b, 21c, and 21d. This similarly applies to the diameter of the other openings 22a, 24a, and 26a. The size that oscillates in a single-mode is properly decided by the position and thickness of each of the unit current aperture layers 20, 22, 24 and 26, the wavelength, etc., and may be 4-4 m or less, for example.

An impurity layer 40 is formed around the vertical resonator 140 in the second mirror 104. This impurity layer 40 is provided for isolating elements. This layer reduces the likelihood or prevents an electric current injected into the vertical resonator 140 from flowing outside of the vertical resonator 140. For example, proton can be used for the impurity layer 40.

An insulation layer 50 is provided on the upper surface of the second mirror 104, and regions other than the upper surface of the vertical resonator 140. The insulation layer 50 electrically separates a first electrode 107 to be described later from the second mirror 104 arranged around the vertical resonator 140.

The first electrode 107 is formed above the circumference of the vertical resonator 140 and above the insulation layer 50. In addition, a part (opening section) where the first electrode 107 is not formed is provided in the central part of the upper surface of the vertical resonator 140. This part is an emission region of laser light. For example, the first electrode 107 is composed of a multilayer film of Au and an alloy of Au and Zn. In addition, a second electrode 109 is formed on the lower surface of the semiconductor substrate 101. For example, the second electrode 109 is composed of a multilayer film of Au and an alloy of Au and Ge.

The materials to form the first and second electrodes 107 and 109 are not limited to those described above, and, for instance, metals, such as Cr, Ti, Ni, Au or Pt and these alloys, etc. can be used depending on the requirements for adhesion enforcement, diffusion prevention or anti-oxidation, etc.

In the example shown in FIG. 11, the vertical resonator 140 has four unit resonators 10, 12, 14 and 16. However, the vertical resonator 140 can have a plurality of unit resonators.

Figure 16:
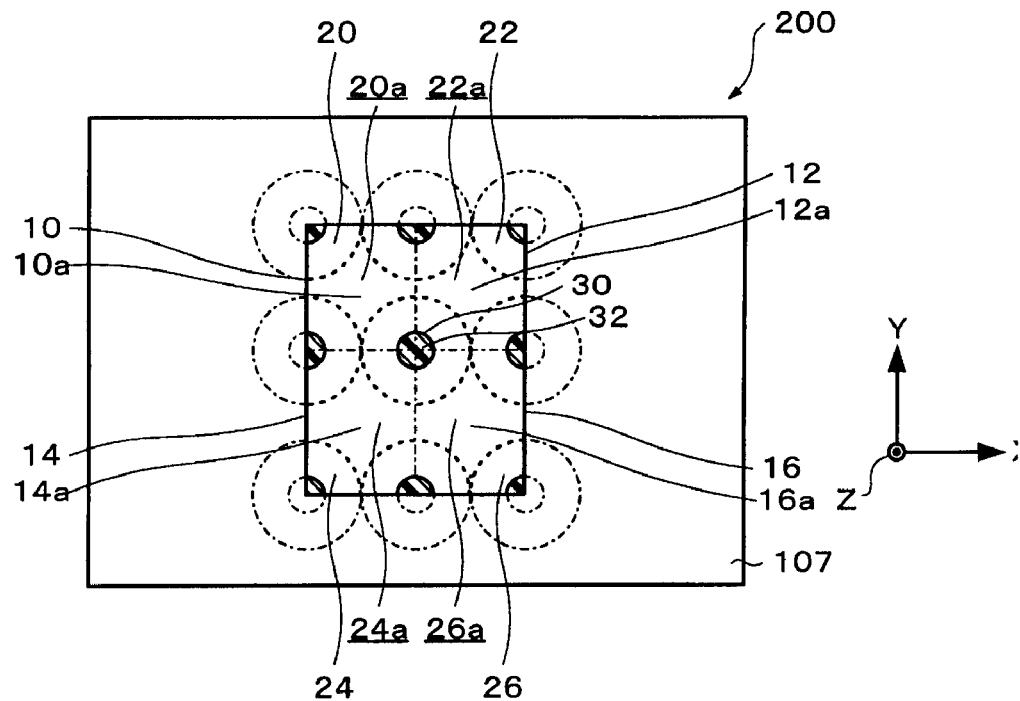
FIG. 16 is a schematic of the surface-emitting type semiconductor laser of the second exemplary embodiment.

Also, in the example shown in FIG. 11, the size of the emission regions 10a, 12a, 14a and 16a of the first through fourth unit resonators 10, 12, 14 and 16 have the same length. However, the emission regions of the unit resonators may have different sizes. For example, as shown in FIG. 16, the size of the emission regions 10a and 12a of the first and second unit resonators 10 and 12 can be formed to have lengths different from the size of the emission regions 14a and 16a of the third and fourth unit resonators 14 and 16. When the sizes of the emission regions have the same length, laser light emitted from the respective emission regions have the same wavelength. However, when the sizes of the emission regions have different lengths, laser light emitted from the respective emission regions have different wavelengths. In the example shown in FIG. 16, the size of each of the emission regions 10a, 12a, 14a and 16a is set such that the wavelength of laser light emitted from the first and second emission regions 10a and 12a is different from the wavelength of laser light emitted from the third and fourth emission regions 14a and 16a. The reason why the wavelength of emitted laser light is different depending on the size (larger or smaller) of each emission region is that the electric resistance differs depending on the size of the emission region. Specifically, because the smaller the size of the emission region, the greater the electric resistance and the greater the heat generated therefrom, compared to an emission region having a larger size, the laser light shifts to the long-wavelength side, and the two emit laser light having different wavelengths.

2-2 Operation of Device

General operations of the surface-emitting type semiconductor laser 200 of the present exemplary embodiment are described below. It is noted that the following method for driving the surface-emitting type semiconductor laser 200 is described as an example, and various changes can be made without departing from the subject matter of the present invention. Details of operations that are substantially the same as those of the first exemplary embodiment are omitted.

The vertical resonator 140 of the surface-emitting type semiconductor laser 200 in accordance with the present exemplary embodiment has a plurality of unit resonators 10, 12, 14 and 16. Each of the emission regions 10a, 12a, 14a and 16a of the unit resonators 10, 12, 14 and 16 has a size that oscillates in a single-mode. Also, the planar configuration of each of the unit resonators 10, 12, 14 and 16 has anisotropy. Since each of the unit resonators 10, 12, 14 and 16 oscillates in a single-mode, its polarization direction is in one direction. Because the planar configuration of each of the unit resonators 10, 12, 14 and 16 has anisotropy, the polarization directions of laser light of the unit resonators 10, 12, 14 and 16 can be aligned according to the anisotropy of the planar configuration of the unit resonators 10, 12, 14 and 16. For this reason, the polarization directions of laser light emitted are aligned. The laser light is emitted with its polarization direction controlled. Specifically, the polarization directions are aligned in the minor axis direction. In the example shown in FIG. 11, for example, the polarization directions are aligned in the X-direction.

In the surface-emitting type semiconductor laser 200 in accordance with the present exemplary embodiment, as shown in FIG. 11, when the unit resonators 10, 12, 14 and 16 have the same size, laser light generated by the unit resonators 10, 12, 14 and 16, have the same wavelength, resulting in oscillation in a single-mode as a whole. When the first and second unit resonators 10 and 12 and the third and fourth unit resonators 14 and 16, have different sizes, as shown in FIG. 16, laser light generated by the first and second unit resonators 10 and 12 and laser light generated by the third and fourth unit resonators 14 and 16 have different wavelengths, resulting in oscillation in a multimode as a whole.

2-3 Device Manufacturing Method

Next, an example of a method of manufacturing the surface-emitting type semiconductor laser 200 in accordance with a second exemplary embodiment of the present invention will be described with reference to FIG. 17 through FIG. 24. FIG. 17, FIG. 19, FIG. 21 and FIG. 23 are schematics showing the method of manufacturing the surface-emitting type semiconductor laser 200 according to the present exemplary embodiment shown in FIG. 11 through FIG. 14. FIG. 18, FIG. 20, FIG. 22 and FIG. 24 are cross-sectional schematics showing the method of manufacturing the surface-emitting type semiconductor laser 200 according to the present exemplary embodiment shown in FIG. 11 through FIG. 14, each of which corresponds to the cross section shown in FIG. 12. Detailed descriptions of steps that are substantially the same as those of the first exemplary embodiment are omitted.

Figure 18:
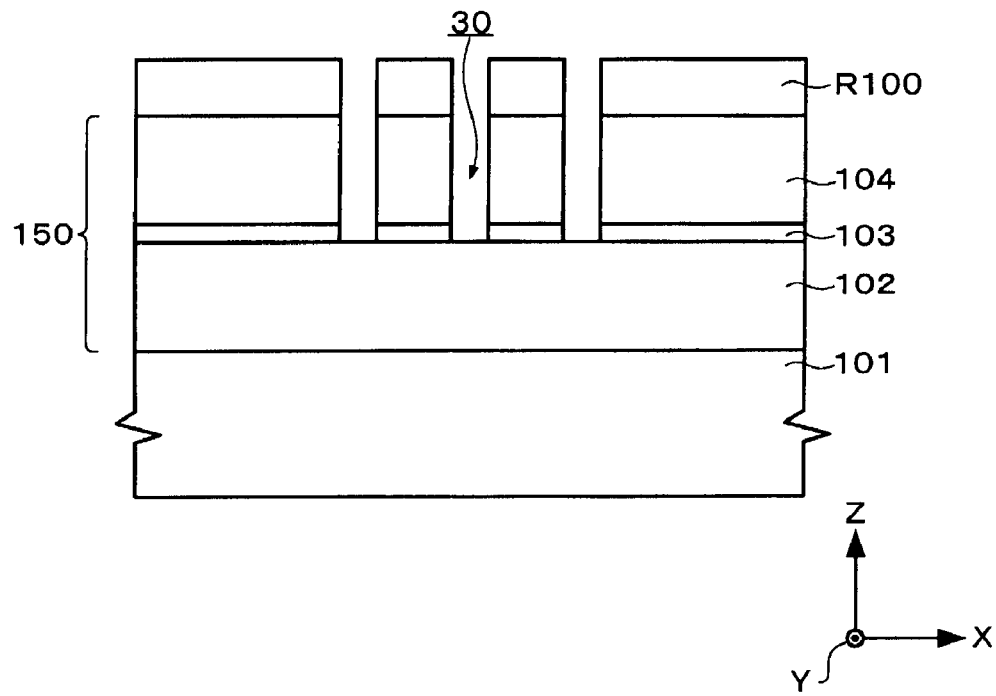
FIG. 18 is a schematic showing a step of manufacturing the surface-emitting type semiconductor laser in accordance with the second exemplary embodiment.

(1) First, on the surface of the semiconductor substrate 101 composed of n-type GaAs, a semiconductor multilayer film 150, shown in FIG. 18, is formed by epitaxial growth while modifying its composition. It is noted here that the semiconductor multilayer film 150 is formed from a first mirror 102, an active layer 103 and a second mirror 104.

When growing the second mirror 104, at least one layer thereof adjacent to the active layer 103 is formed as an AlAs layer or an AlGaAs layer that is later oxidized and becomes current aperture layers 20, 22, 24 and 26 (see FIG. 11).

Figure 17:
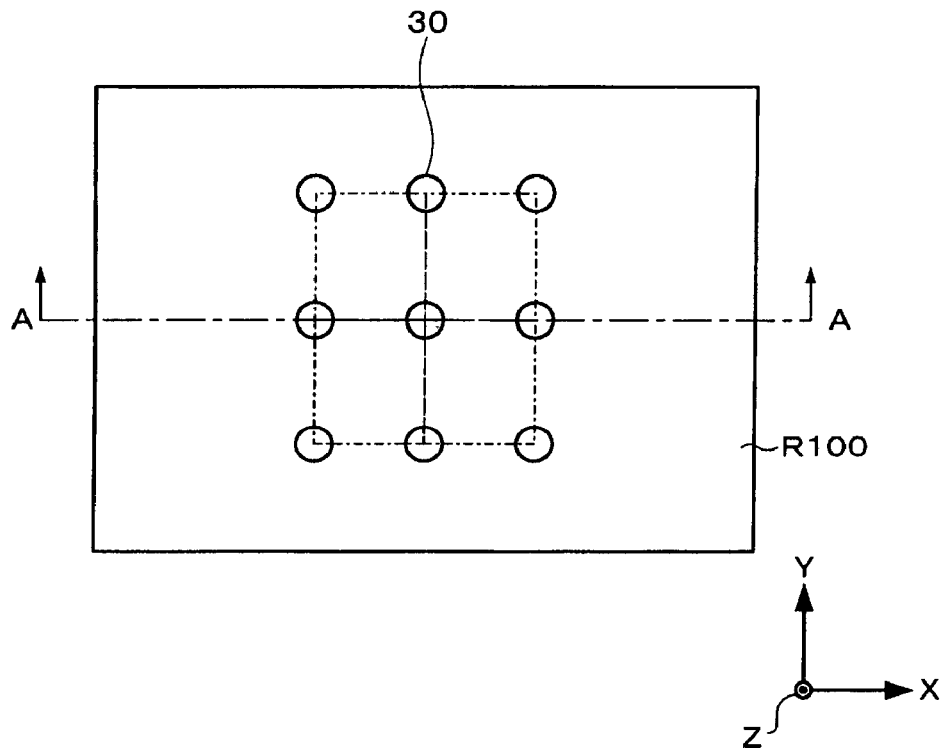
FIG. 17 is a schematic showing a step of manufacturing the surface-emitting type semiconductor laser in accordance with the second exemplary embodiment.

Then, resist is coated on the semiconductor multilayer film 150. Then the resist is patterned by a photolithography method, thereby forming a first mask layer R100 having a specified pattern, as shown in FIG. 17 and FIG. 18. The first mask layer R100 is formed over the second mirror 104 except regions where aperture sections 30 (see FIG. 1) are to be formed. Specifically, the aperture sections 30 are disposed at intersections of longitudinal and transverse lines that compose a lattice shape. For example, in the example of FIG. 11, the longitudinal direction is the Y-direction, and transverse direction is the X-direction. Pitch widths of the longitudinal and transverse lines of the lattice shape can be different from one another. For example, in the example of FIG. 11, the pitch width in the Y-direction is greater than the pitch width in the X-direction. In the example of FIG. 11, the pitch widths in the X-direction are the same, and the pitch widths in the Y-direction are the same. However, the pitch widths in the X-direction can be different from one another, and the pitch widths in the Y-direction can be different from one another.

Next, by using the first mask layer R100 as a mask, at least the second mirror 104 is etched by, for example, a dry etching method, thereby forming the aperture sections 30, as shown in FIG. 17 and FIG. 18. Then, the first mask layer R100 is removed.

Figure 19:
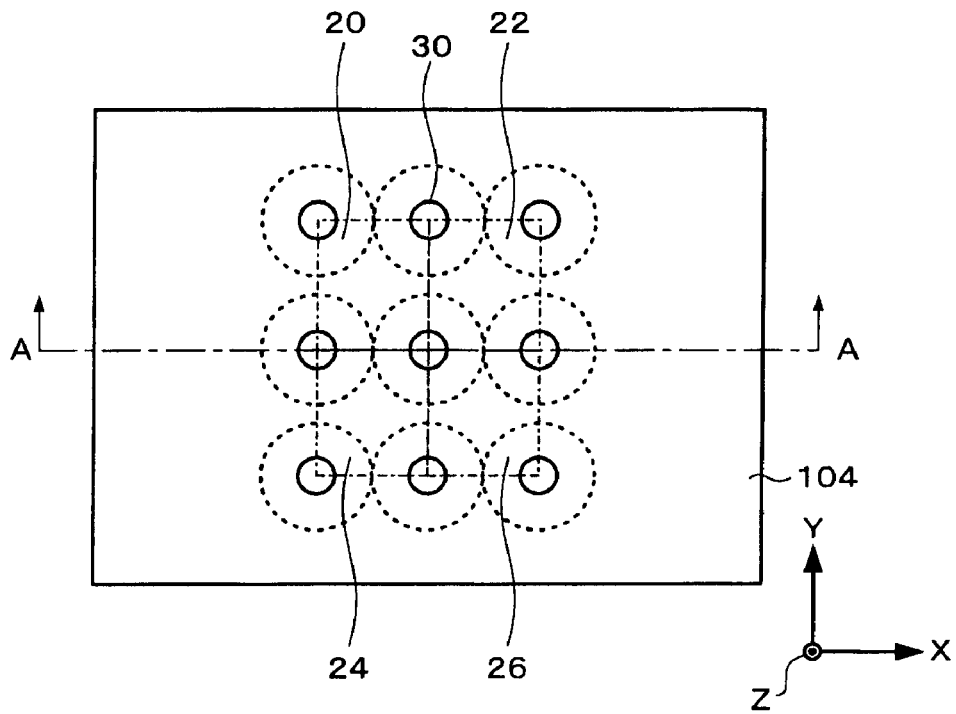
FIG. 19 is a schematic showing a step of manufacturing the surface-emitting type semiconductor laser in accordance with the second exemplary embodiment.
Figure 20:
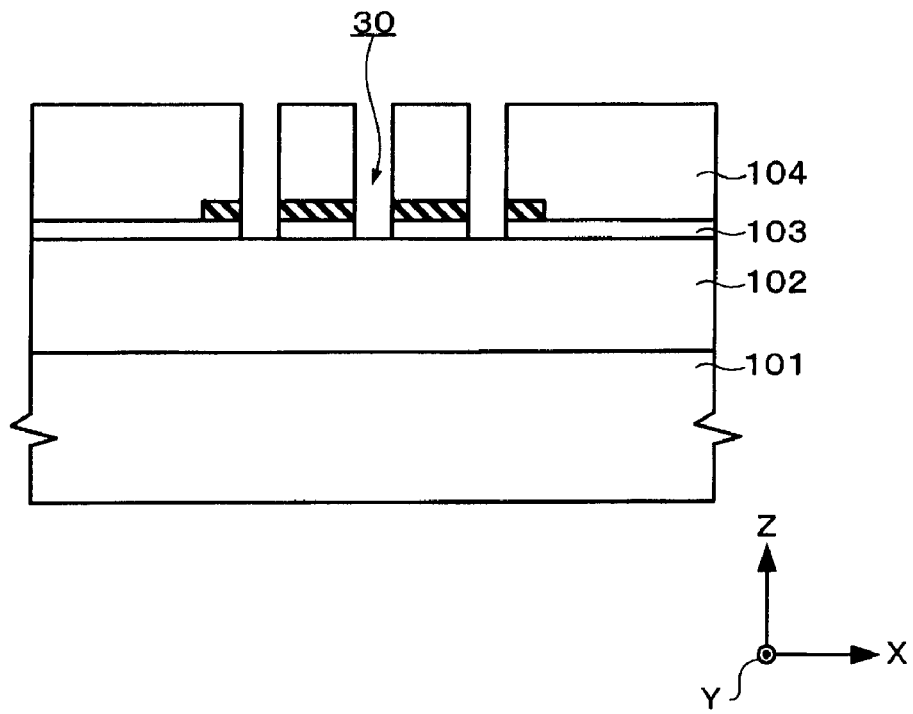
FIG. 20 is a schematic showing a step of manufacturing the surface-emitting type semiconductor laser in accordance with the second exemplary embodiment.

Next, by placing the semiconductor substrate 101 in a water vapor atmosphere at about 400° C., for example, the layer having a high Al composition (a layer with an Al composition being 0.95 or higher) among the second mirror 104 is oxidized from its side surface through the aperture sections 30, thereby forming the current aperture layers 20, 22, 24 and 26, as shown in FIG. 19 and FIG. 20. The oxidation rate depends on the temperature of the furnace, the amount of water vapor supply, and the Al composition and the film thickness of the layer to be oxidized. Then, the apertures 30 are embedded with embedding insulation layers 32.

Figure 21:
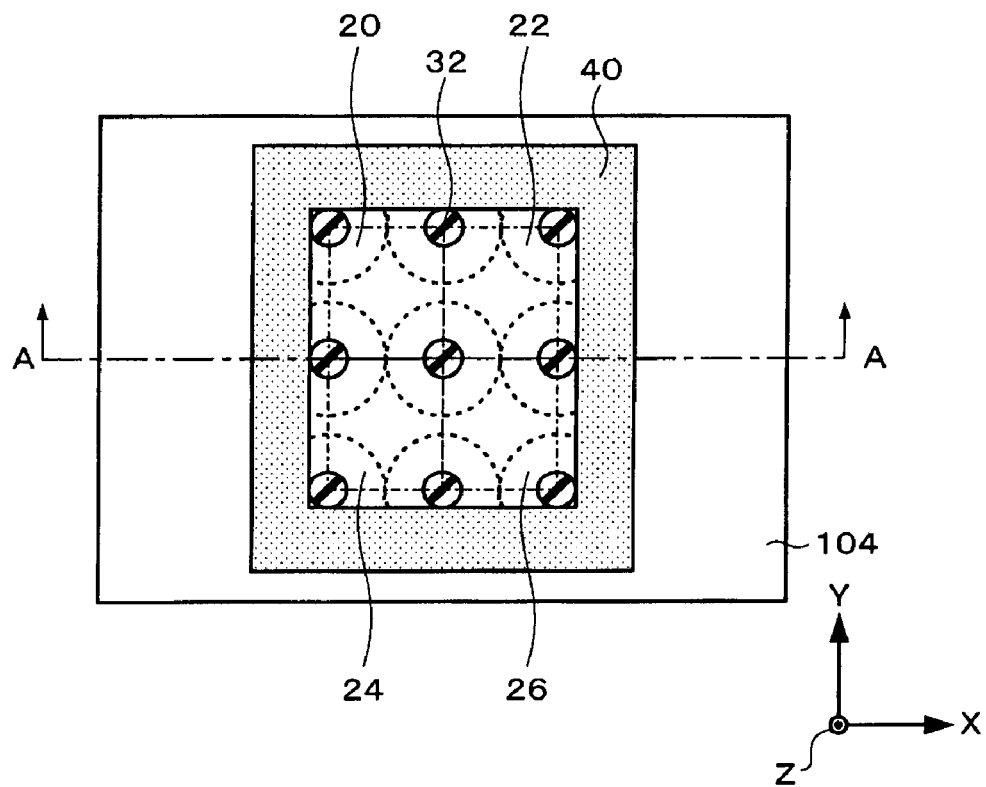
FIG. 21 is a schematic showing a step of manufacturing the surface-emitting type semiconductor laser in accordance with the second exemplary embodiment.
Figure 22:
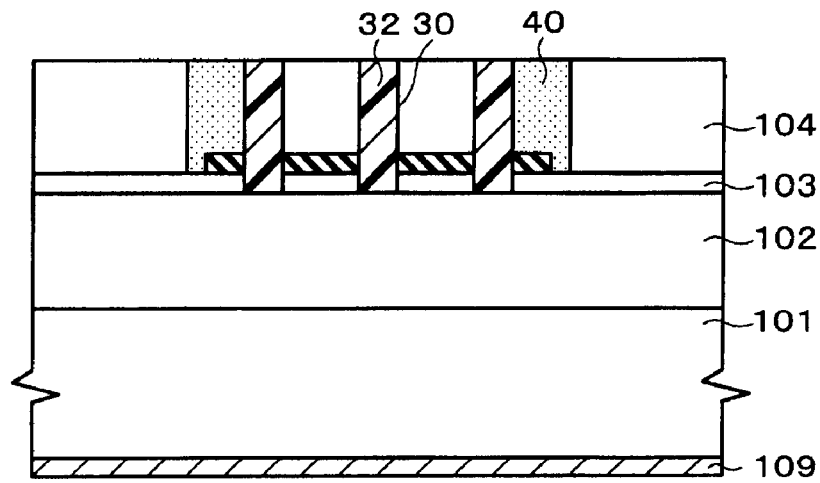
FIG. 22 is a schematic showing a step of manufacturing the surface-emitting type semiconductor laser in accordance with the second exemplary embodiment.
Figure 22:
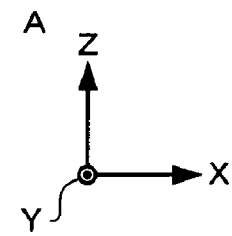

(2) Next, an impurity layer 40 that surrounds the vertical resonator 140 is formed, as shown in FIG. 21 and FIG. 22. The impurity layer 40 can be formed by forming a mask layer by using an ordinary lithography technique, and injecting prescribed impurities into the second mirror 104.

Figure 23:
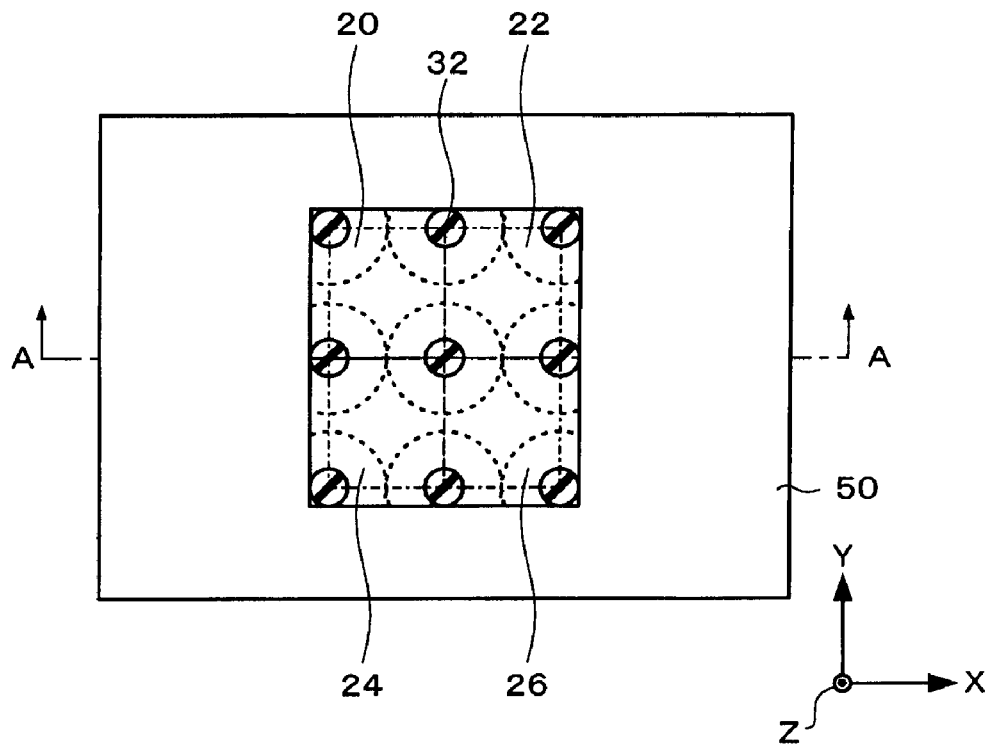
FIG. 23 is a schematic showing a step of manufacturing the surface-emitting type semiconductor laser in accordance with the second exemplary embodiment.
Figure 24:
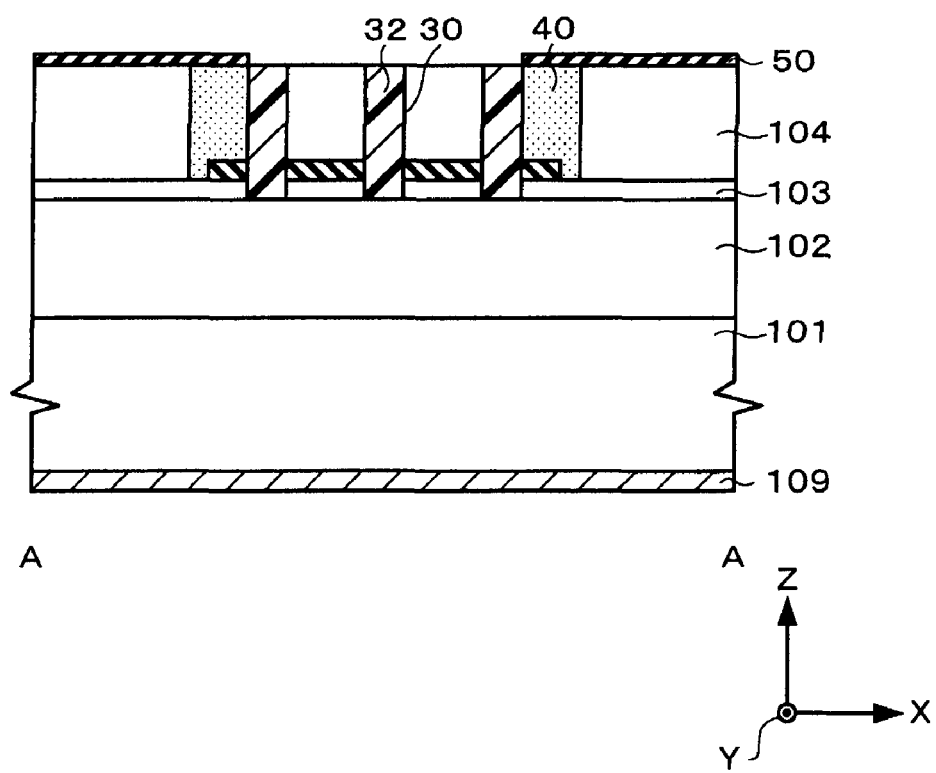
FIG. 24 is a schematic showing a step of manufacturing the surface-emitting type semiconductor laser in accordance with the second exemplary embodiment.

(3) Next, an insulation layer 50 is formed on the upper surface of the second mirror 104, and in regions other than on the vertical resonator 140, as shown in FIG. 23 and FIG. 24. For example, the insulation layer 50 can be formed by a CVD method, or the like. For example, silicon oxide, silicon nitride or polyimide can be used for the insulation layer 50.

(4) Next, a process of forming a first electrode 107 and a second electrode 109 for injecting an electric current into the active layer 103 is described.

First, for example, a multilayer film of Au and an alloy of Au and Zn is formed by, for example, a vapor deposition method over the upper surface of the circumference of the vertical resonator 140 and on the upper surface of the insulation layer 50. Then, a part where the above-mentioned multilayer film is not formed is formed by a lift-off method on the upper surface of the vertical resonator 140. This part becomes an emission surface of laser light. A dry etching method or a wet etching method can be used in the above-mentioned step instead of the lift-off method.

Also, a multilayer film of Au and an alloy of Au and Ge, for example, is formed by, for example, a vacuum deposition method on the lower surface of the semiconductor substrate 101 which is exposed. Next, an annealing treatment is conducted. By the steps described above, the first electrode 107 and the second electrode 109 are formed.

By the process described above, the surface-emitting type semiconductor laser 200 shown in FIG. 11 and FIG. 14 can be obtained.

2-4. Functions and Effect

Main functions and effect of the surface-emitting type semiconductor laser 200 in accordance with the present exemplary embodiment are described below.

In the surface-emitting type semiconductor laser 200 of the present exemplary embodiment, the vertical resonator 140 has a plurality of unit resonators 10, 12, 14 and 16. Each of the emission regions 10a, 12a, 14a and 16a of the respective unit resonators 10, 12, 14 and 16 has a size that oscillates in a single-mode. Also, each of the unit resonators 10, 12, 14 and 16 has anisotropy. Since each of the unit resonators 10, 12, 14 and 16 oscillates in a single-mode, its polarization direction is in one direction. Because the planar configuration of each of the unit resonators 10, 12, 14 and 16 has anisotropy, the polarization directions of laser light of the unit resonators 10, 12, 14 and 16 can be aligned according to the anisotropy of the planar configuration of the unit resonators 10, 12, 14 and 16. For this reason, the polarization directions of laser light emitted are aligned. In other words, in accordance with the surface-emitting type semiconductor laser 200 of the present exemplary embodiment, the polarization direction of laser light to be emitted can be controlled.

Also, according to the surface-emitting type semiconductor laser 200 in accordance with the present exemplary embodiment, either in single-mode oscillation or multimode oscillation of laser light, the emission pattern can be formed into an optional shape by controlling the planar configuration, number and arrangement of unit emission regions. For this reason, the present exemplary embodiment can be extensively employed in light sources of laser printers, sensors and the like.

Although exemplary embodiments of the present invention are described above, the present invention is not limited to these embodiments, and many modifications can be made within the scope of the subject matter. In the exemplary embodiments described above, the description was made as to a two-face electrode structure in which the first electrode 107 is formed on the upper surface of the second mirror 104, and the second electrode 109 is formed on the lower surface of the semiconductor substrate 101. However, a one-face electrode structure in which the first electrode 107 is formed on the upper surface of the second mirror 104 and the second electrode 109 is formed on the upper surface of the first mirror 102 can also be made.

In the above described exemplary embodiments, the description is made as to an AlGaAs type surface-emitting laser, but the present invention is also applicable to other types of surface-emitting lasers, such as, for example, GaInP type, ZnSSe type, InGaN type, AlGaN type, InGaAs type, GaInNAs type, GaAsSb type, and like.

What is claimed is:

1. A surface-emitting type semiconductor laser, comprising:
a substrate;
a vertical resonator above the substrate, the vertical resonator including:
a first mirror, an active layer and a second mirror disposed in this order from the substrate; and
a plurality of unit resonators, an emission region of each of the plurality of unit resonators having a diameter that oscillates in a single-mode, each of the plurality of unit resonators having an identical diameter, and laser light of each of the unit resonators has an identical wavelength, wherein each unit resonator has a rectangular shape in plan view and includes an aperture section in each corner of the unit resonator, the aperture section being formed of an insulating material that is disposed on the first mirror, a current aperture layer is disposed around each aperture section, the current aperture layer being formed of an insulating material that is disposed between the active layer and the second mirror, and the emission region is defined by an outer edge of the current aperture layer formed around each aperture section.

2. The surface-emitting type semiconductor laser according to claim 1, wherein each aperture section forms a ¼ circle in plan view, and
the current aperture layer is concentric with each aperture section.

* * * * *